(12) United States Patent
Farooq

(10) Patent No.: US 6,760,277 B1
(45) Date of Patent: Jul. 6, 2004

(54) ARRANGEMENT FOR GENERATING MULTIPLE CLOCKS IN FIELD PROGRAMMABLE GATE ARRAYS OF A NETWORK TEST SYSTEM

(75) Inventor: Rizwan M. Farooq, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 437 days.

(21) Appl. No.: 09/860,528

(22) Filed: May 21, 2001

Related U.S. Application Data

(60) Provisional application No. 60/281,823, filed on Apr. 6, 2001.

(51) Int. Cl.[7] .............................. G06F 1/04; H03L 7/00; H06F 1/04; H04B 17/00
(52) U.S. Cl. ........................ 368/155; 327/145; 327/291; 375/224; 702/115
(58) Field of Search ............................ 368/3, 113, 118, 368/155, 156; 323/237, 241; 326/101; 327/141, 144, 145, 147, 291, 295, 297; 702/125; 375/224; 713/500, 501

(56) References Cited

U.S. PATENT DOCUMENTS

| | | | | |
|---|---|---|---|---|
| 5,430,397 A | * | 7/1995 | Itoh et al. | 326/101 |
| 5,544,203 A | * | 8/1996 | Casanata et al. | 375/376 |
| 5,751,665 A | * | 5/1998 | Tanoi | 368/120 |
| 5,953,335 A | | 9/1999 | Erimli et al. | |
| 6,285,172 B1 | * | 9/2001 | Torbey | 323/237 |
| 6,467,044 B1 | * | 10/2002 | Lackey | 713/501 |

* cited by examiner

Primary Examiner—Vit W. Miska
(74) Attorney, Agent, or Firm—Manelli Denison & Selter PLLC; Leon R. Turkevich

(57) ABSTRACT

A test system for a design of a network device under test includes an oscillator configured for generating a first clock signal for a first clock domain, and field programmable gate arrays. Each field programmable gate array is configured for performing device operations according to the first clock domain and transferring data to another device at a network data rate based on a second clock domain. Each field programmable gate array includes clock conversion logic configured for generating a second clock signal for the second clock domain, based on the first clock signal. Hence, the generation of the second clock signal within each field programmable gate array ensures that timing accuracy is maintained, enabling communication between the field programmable gate arrays at high-speed data rates based on the second clock domain.

9 Claims, 1 Drawing Sheet

US 6,760,277 B1

ARRANGEMENT FOR GENERATING MULTIPLE CLOCKS IN FIELD PROGRAMMABLE GATE ARRAYS OF A NETWORK TEST SYSTEM

This application claims priority from Provisional Application No. 60/281,823, filed Apr. 6, 2001.

BACKGROUND OF THE INVENTION

1. Field of the Invention

The present invention relates to testing the design of a prescribed system using field programmable gate arrays prior to implementation on mass-produced application-specific integrated circuits (ASICs).

2. Background Art

Local area networks use a network cable or other media to link stations on the network. Each local area network architecture uses a media access control (MAC) enabling network interface devices at each network node to access the network medium.

Switched local area networks such as Ethernet (IEEE 802.3) based systems are encountering increasing demands for higher speed connectivity, more flexible switching performance, and the ability to accommodate more complex network architectues. Hence, network switch designers and test engineers need to be able to minimize the time and expense needed to evaluate designs during prototyping of Ethernet-based network systems, for example an integrated multiport switch as illustrated in commonly-assigned U.S. Pat. No. 5,953,335.

Integrated network switches are implemented by reduction to silicon as an application-specific integrated circuit. Implementation of such integrated network switches using application-specific integrated circuits (ASICs) typically requires reduction to silicon of laze amounts of programming code, written for example at Register Transfer Level (RTL) using Hardware Description Language (HDL). The programming code is used to specify the operations for the network switch.

Typically field programmable ASICs, for example field program able gate arrays (FPGAs), can be used for testing the design, logic and operation of a device under test on a test board; once the design of the device under test has been fully tested and validated, the design of the device under test is converted to a mask programmable ASIC for production purposes.

One problem in testing communications designs using FPGAs, such for testing designs implementing the above-described integrated multiport switch, involves the errors introduced when multiple clock domains are required. In particular, FIG. 1 is a diagram illustrating a conventional (Prior Art) test system 10 having oscillators 12a and 12b for generating respective clock signals (CLK1 and CLK2) for use by communications devices 14a and 14b. The clock signals CLK1 and CLK2 are intended to be used by the communications devices 14a and 14b for sending data between each other. For example, the first clock signal CLK1 may be used by a first logic module 18 within each of the communications devices 14a and 14b for performing internal logic operations (e.g., internal data transfer, switch processing, etc.), whereas the second clock signal CLK2 may be used to drive a transmit and receive logic module 20 for transfer of data between the communications devices 14a and 14b at prescribed data rates.

However, the supply of the clock signals CLK1 and CLK2 across the clock signal paths 16a and 16b may introduce errors in that the propagation delays and/or capacitance introduced by the clock signal paths 16a and 16b may skew the clock signal timing between the clock signals. Hence, the data trier between the communications devices 14a and 14b may be out of sync depending on the relationship between the fast clock signal CLK1 and the second clock signal CLK2.

SUMMARY OF THE INVENTION

There is a need for an arrangement that ensures reliable transfer of data between multiple communications devices utilizing multiple clock domains.

There also is a need for an arrangement that enables multiple communications devices to be synchronized without the necessity of multiple oscillator sources for driving respective clock domains in the communications devices.

These and other needs are attained by the present invention, where a test system for a design of a network device under test includes an oscillator configured for generating a first clock signal for a first clock domain, and field programmable gate arrays. Each field programmable gate array is configured for performing device operations according to the first clock domain and transferring data to another device at a network data rate based on a second clock domain. Each field programmable gate array includes clock conversion logic configured for generating a second clock signal for the second clock domain, based on the first clock signal. Hence, the generation of the second clock signal within each field programmable gate array ensures that timing accuracy is maintained, enabling communication between the field programmable gate arrays at high-speed data rates based on the second clock domain.

One aspect of the present invention provides a method. The method includes outputting from a clock source a first clock signal for a first clock domain to first and second devices. The first and second devices each have a first logic module configured for operating according to the first clock domain and a second logic module configured for outputting data according to a second clock domain. The method also includes generating within each of the first and second devices a second clock signal, based on the first clock signal, for the corresponding second clock domain, and transferring data between the first and second devices according to the second clock domain.

Another aspect of the present invention provides a test system. The test system includes a clock source configured for outputting a first clock signal, and first and second devices. Each of the first and second devices includes a first logic module, a converter, and a second logic module. The first logic module is configured for operating according to a first clock domain based on the first clock signal. The converter is configured for generating a second clock signal based on the first clock signal, and the second logic module is configured for transferring data to a corresponding connected device according to a second clock domain based on the second clock signal.

Additional advantages and novel features of the invention will be set forth in part in the description which follows and in part will become apparent to those skilled in the art upon examination of the following or may be learned by practice of the invention. She advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 2:
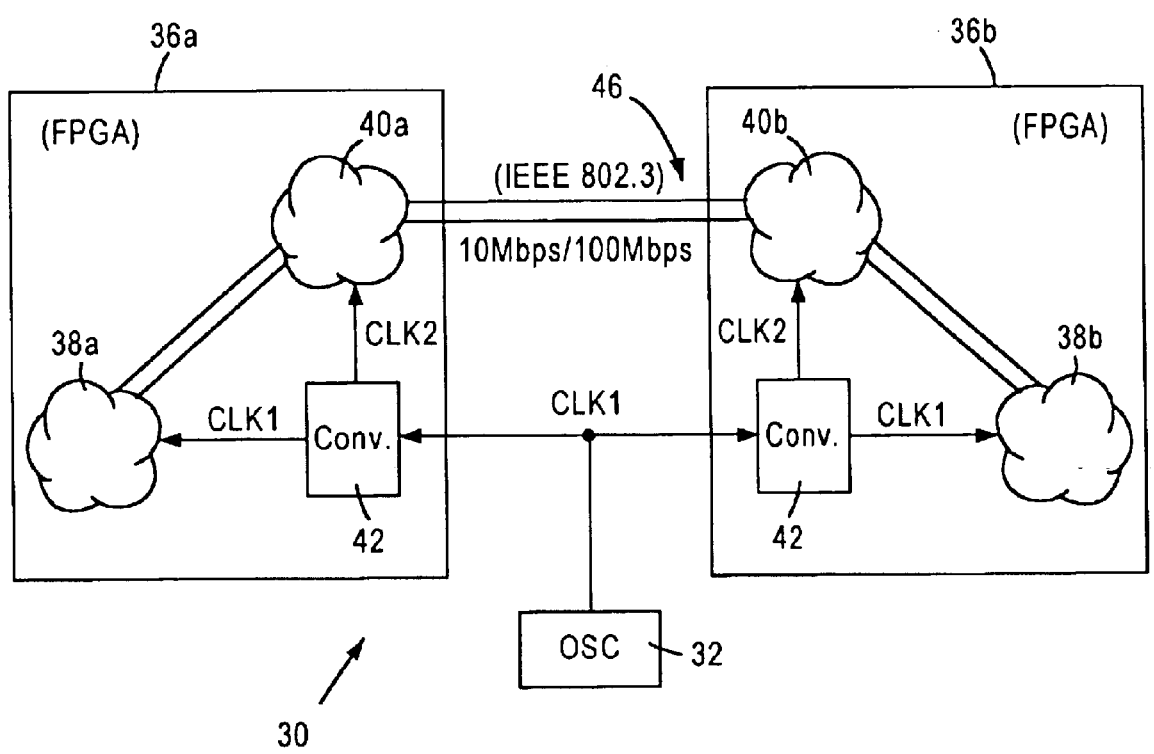
FIG. 2 is a diagram illustrating a system for testing communication device requiring multiple clock domains, such as a network device, according to an embodiment of the present invention.

FIG. 2 is a block diagram illustrating a test system 30 configured for testing a logic design for a network device, for example an integrated multiport network switch, as described in the above-identified U.S. Pat. No. 5,953,335. In particular, the test system 30 includes a clock source 32, for example an oscillator, configured for outputting a first clock signal (CLK1) via a clock signal path 34. The test system 30 also includes devices 36a and 36b configured for performing test operations, for example emulating the logic of the above-described integrated multiport network switch.

Each of the devices 36, implemented as a field programmable gate array (FPGAs), includes a first logic module 38 configured for performing prescribed network operations according to a first clock domain driven by the first clock signal (CLK1), for example network switching, internal data transfer, interfacing with a host CPU controller, etc. The logic module 38a and the logic module 38b may be identical, alternately the logic modules 38 may implement different logic operations, depending on the nature of the test procedure. For example, the logic module 38a may be configured for simulating the logic of network switching operations, whereas the logic module 38b may be used for converting data received from the devices 36a to another format or data rate for another test device (not shown).

Figure 1:
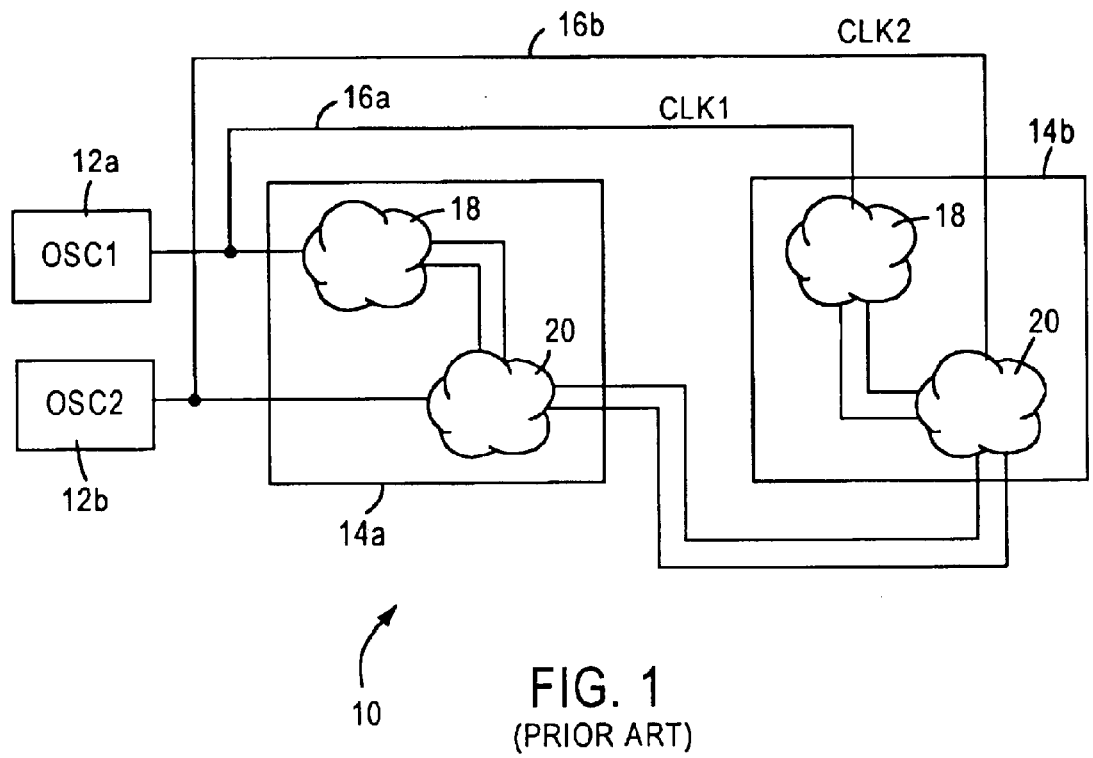
FIG. 1 is a block diagram illustrating a conventional (Prior Art) arrangement for testing communication device logic requiring multiple clock domains.

Each of the devices 36 also includes a second logic module 40 configured for transferring data to a corresponding connected device 36 according to a second clock domain driven by a second clock signal (CLK2). As described above, the FPGAs 36 used for testing the network switch design require that the relatively high-speed ft and second clocks CLK1 and CLK2 have precise tolerances to enable testing of the network switching logic using the FPGAs 36 having the logic modules 38 and 40. However, generation of the second clock signal via an external source, as illustrated in FIG. 1, causes clock skew problems that affects the testing of the device logic.

According to the disclosed embodiment each FPGAs 36 includes a converter 42 configured for generating the second clock signal CLK2 based on the first clock signal CLK1. The converter 42 outputs the second clock signal CLK2 to the corresponding second logic module 40, enabling the corresponding second logic module 40 to transfer data based on the second clock domain CLK2. In particular, the converter 42, implemented for example as a clock generator, a multiplier, or a divider, locally generates the second clock signal CLK2 for the corresponding second logic module 40, minimizing timing distortions that may otherwise occurred due to capacitive influences or propagation delays.

Hence, the second logic module 40 can output data to the corresponding connected device 32 via a connected medium 46 according to a high-speed protocol, for example 10 Mbps or 100 Mbps Ethernet (IEEE 802.3) protocol. The connected medium 46 may be a network based medium such as 10BaseT, etc., or may be a media independent interface (MII) cable configured for connecting the media independent interfaces of network switch ports.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method in a test system for testing prescribed network operations, the method comprising:

outputting from a clock source a first clock signal for a first clock domain to first and second devices, the first and second devices each implemented as a field programmable gate array and each having a first logic module configured for operating according to the first clock domain and a second logic module configured for outputting data according to a second clock domain distinct from the first clock domain, each first logic module configured for performing at least a portion of the prescribed network operations;

generating within each of the first and second devices a second clock signal, based on the first clock signal, for the corresponding second clock domain; and transferring data between the first and second devices according to the second clock domain.

2. The method of claim 1, wherein the generating step includes generating the second clock signal using one of a clock generator, a multiplier, and a divider within the corresponding device.

3. The method of claim 2, wherein at least one of the first logic modules is configured for performing prescribed network switch operations.

4. The method of claim 3, wherein the transferring step includes using the second logic module of each field programmable gate array for sending and receiving data packets, based on the second clock domain, according to IEEE 802.3 protocol.

5. The method of claim 4, wherein the transferring step includes transferring the data at one of 10 Mbps and 100 Mbps.

6. A test system configured for testing prescribed network operations, the test system comprising:

a clock source configured for outputting a first clock signal; and first and second devices, each implemented as a field programmable gate array and each having:

(1) a first logic module configured for performing a corresponding prescribed network operation according to a first clock domain based on the first clock signal, (2) a converter configured for generating a second clock signal based on the first clock signal, and (3) a second logic module configured for transferring data to a corresponding connected device according to a second clock domain, distinct from the first clock domain, based on the second clock signal.

7. The system of claim 6, wherein the converter is configured for generating the second clock enabling the corresponding second logic module to transfer data according to IEEE 802.3 protocol.

8. The system of claim 7, wherein first logic module is configured for performing prescribed network switch operations.

9. The system of claim 7, wherein the second clock enables the second logic module to transfer data at one of 10 Mbps and 100 Mbps.

* * * * *